March 28, 1961 R. J. MOLNAR 2,977,546

TRANSISTOR AMPLIFIER CIRCUIT

Filed Aug. 29, 1957

INVENTOR.
ROBERT J. MOLNAR
BY
ATTORNEY

United States Patent Office 2,977,546

Patented Mar. 28, 1961

2,977,546

TRANSISTOR AMPLIFIER CIRCUIT

Robert J. Molnar, New York, N.Y., assignor to The Bendix Corporation, a corporation of Delaware Filed Aug. 29, 1957, Ser. No. 680,947

4 Claims. (Cl. 330—25)

This invention relates to transistor amplifier circuits. In conventional transistor circuits biasing resistors have been arranged in the circuit in such a fashion as to shunt other circuit elements and thereby reduce the input resistance and the equivalent A.C. load resistance of the circuit. In accordance with this invention the circuit elements are arranged so that the biasing resistors no longer shunt these elements and this results in an increase in the input resistance and an increase in the equivalent A.C. load resistance over that obtainable with conventional prior art circuits. The changes referred to above provide a substantial increase in the voltage gain attainable with a single transistor stage.

An object of this invention is to provide a transistor amplifier in which a single stage has a voltage gain substantially greater than that provided by conventional transistor amplifiers.

Another object of this invention is to provide a transistor amplifier circuit having an input resistance greater than that provided by conventional grounded emitter transistor amplifier circuits.

A further object of this invention is to provide a transistor amplifier circuit having a large voltage gain and a high input resistance without sacrificing other operating characteristics of the amplifier circuit.

Yet another object of this invention is to provide a transistor amplifier circuit wherein the output resistance of the circuit is decreased and thereby affords better matching to a succeeding amplifier stage.

The foregoing and other objects and advantages of the present invention will appear more fully hereinafter from a consideration of the detailed description which follows, taken together with the accompanying drawing wherein one embodiment of the invention is illustrated by way of example. It is to be expressly understood, however, that the drawing is for the purpose of illustration and description only, and is not to be construed as defining the limits of the invention.

Figure 1:
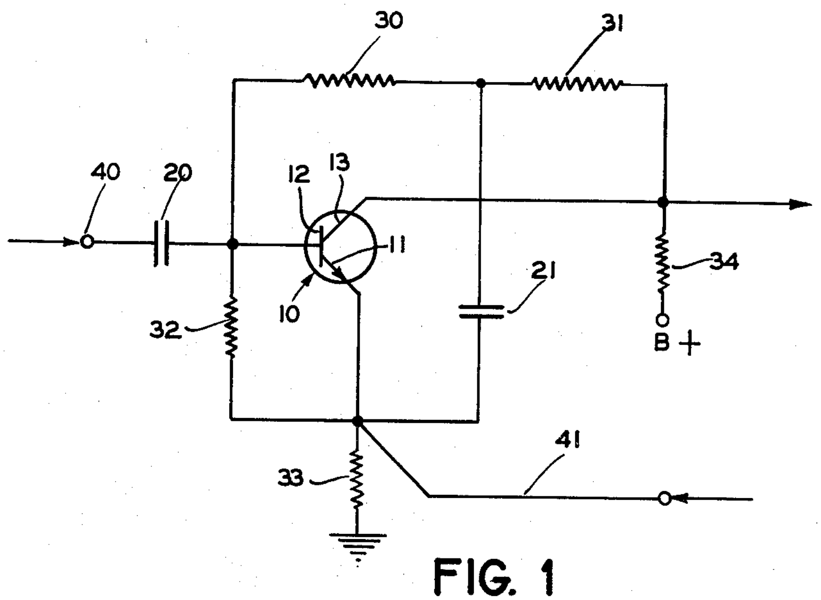
Figure 1 is a diagrammatic illustration of an embodiment of the invention.

Figure 1 shows a novel amplifier constructed according to the invention and comprises a transistor 10 having an emitter 11, a base 12 and a collector 13. An input terminal 40 for an alternating current signal is connected by a coupling condenser 20 to base 12 of transistor 10. Biasing resistors 30 and 31 are connected between base 12 and collector 13 and a biasing resistor 32 is connected between base 12 and emitter 11. A feedback resistor 33 connects emitter 11 to a common potential point, such as ground, and load resistor 34 connects collector 13 to a source of B+ potential. A by-pass capacitor 21 is connected to the connection between resistors 30, 31 and emitter 11. With this arrangement, emitter 11 has a common connection to the input and the output of the amplifier and is referred to herein as a common emitter.

A succeeding stage of amplification identical to the one just described may be connected to collector 13. If feedback from the output of the succeeding stages is desired it may be applied to emitter 11 through a lead 41.

Figure 2:
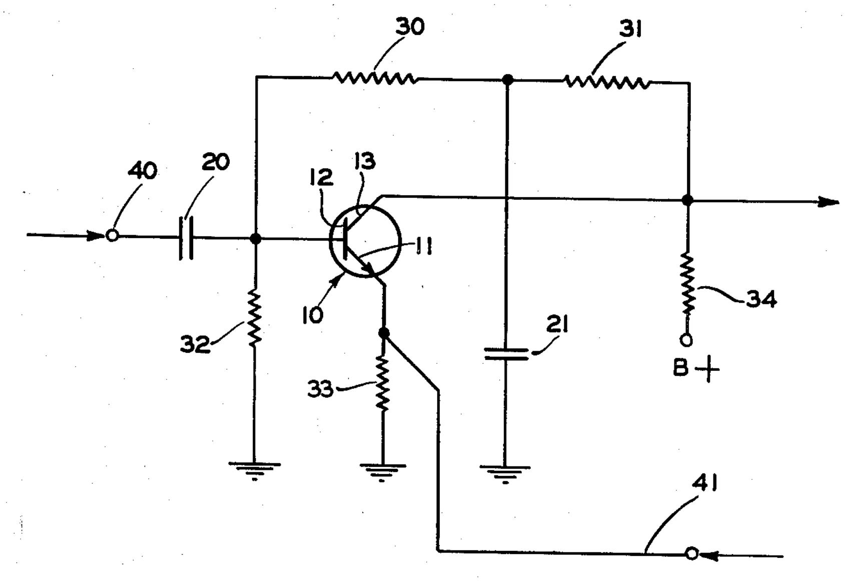
Figure 2 is a diagrammatic illustration of a conventional transistor amplifier circuit.

Figure 2 shows a conventional amplifier wherein biasing resistor 32 and by-pass condenser 21 are each directly connected to ground. All of the elements shown in the circuit arrangements of Figures 1 and 2 may have the same values and the same connections except for the connection of biasing resistor 32 and by-pass condenser 21.

The circuit arrangement shown in Figure 1 produces significant changes in voltage gain and input and output resistance over those obtainable with the conventional circuit of Figure 2. For a given set of element values the maximum voltage gain attainable with the conventional circuit of Figure 2 is 30. With these same elements connected in accordance with the invention as shown in Figure 1 the voltage gain attainable is 37, a 23% increase. The input resistance of the conventional circuit of Figure 2 is 16,000 ohms and of the novel circuit of Figure 1, 27,500 ohms, an increase of 71%. The output resistance of the novel circuit of Figure 1 is likewise decreased over the conventional circuit of Figure 2 by a substantial amount.

These results are obtained in the circuit of Figure 1 because parallel connected biasing resistors 30 and 32 are in series with feedback resistor 33 and do not shunt the circuit input as is the case in the conventional circuit of Figure 2, and biasing resistor 31 is in series with the load resistor 34 and does not shunt the circuit output as is the case in the conventional circuit of Figure 2. Therefore, the input resistance and voltage gain are substantially increased and the output resistance is substantially decreased.

Although one embodiment of the invention has been illustrated in detail, it is to be expressly understood that the invention is not limited thereto. Various changes may be made in design and arrangement of the parts without departing from the spirit and scope of invention as will now be understood by those skilled in the art.

I claim:

1. A transistor amplifier circuit comprising a transistor having a base, a collector and a common emitter, input means for applying a signal between the base and a common potential point, output means connected to the collector, a feedback resistor connected between the emitter and the common potential point, biasing means connecting said base and said collector and including a pair of direct current conductive elements at least one of which is a resistor, and by-pass means connecting said biasing means at a point between the elements directly to said emitter.

2. A transistor amplifier circuit comprising a transistor having a base, a collector and a common emitter, input means for applying a signal between the base and a common potential point, output means connected to the collector, a feedback resistor connected between the emitter and the common potential point, biasing means connecting said base and said collector and including a pair of resistors, and by-pass means connecting said biasing means at a point between the resistors directly to said emitter.

3. A transistor amplifier comprising a transistor having a base, a collector and a common emitter, means for applying a signal to the base, a biasing resistor connected directly between the base and emitter, biasing means connected between the base and collector and including a pair of direct current conducting elements at least one of which is a resistor, a by-pass condenser connected to said biasing means between the elements and directly to said emitter, and a feedback resistor connected between said emitter and a common potential point.

4. A transistor amplifier comprising a transistor having a base, a collector and a common emitter, means for applying a signal to the base, a biasing resistor connected directly between the base and emitter, biasing means connected between the base and collector and including a pair of resistors, a by-pass condenser connecting to said biasing means between the resistors and directly to said emitter, and a feedback resistor connected between said emitter and a common potential point.

References Cited in the file of this patent

UNITED STATES PATENTS

| | | |
|---|---|---|
| 2,522,521 | Kock | Sept. 19, 1950 |
| 2,644,895 | Lo | July 7, 1953 |
| 2,694,113 | Meacham | Nov. 9, 1954 |
| 2,816,964 | Giacoletto | Dec. 17, 1957 |
| 2,822,430 | Lin | Feb. 4, 1958 |
| 2,822,434 | Ehret | Feb. 4, 1958 |
| 2,848,603 | Schultz | Aug. 19, 1958 |
| 2,858,379 | Stanley | Oct. 28, 1958 |
| 2,866,859 | Stanley | Dec. 30, 1958 |
| 2,866,892 | Barton | Dec. 30, 1958 |
| 2,892,045 | Aronson | June 23, 1959 |

OTHER REFERENCES

Publication, Wireless World, November 1956, page 98, "Transistor Highgain Preamplifier" Advertisement.